(12) United States Patent
Feiweier

(10) Patent No.: US 10,495,714 B2
(45) Date of Patent: *Dec. 3, 2019

(54) METHOD AND APPARATUS FOR RECORDING OF DIFFUSION-WEIGHTED MAGNETIC RESONANCE IMAGE DATA WITH ANISOTROPIC DIFFUSION DIRECTIONS

(71) Applicant: Siemens Healthcare GmbH, Erlangen (DE)

(72) Inventor: Thorsten Feiweier, Poxdorf (DE)

(73) Assignee: Siemens Healthcare GmbH, Erlangen (DE)

(*) Notice: Subject to any disclaimer, the term of this patent is extended or adjusted under 35 U.S.C. 154(b) by 219 days.

This patent is subject to a terminal disclaimer.

(21) Appl. No.: 15/589,026

(22) Filed: May 8, 2017

(65) Prior Publication Data

US 2017/0322281 A1    Nov. 9, 2017

(30) Foreign Application Priority Data

May 9, 2016 (DE) ......................... 10 2016 207 910

(51) Int. Cl.
*G01R 33/563* (2006.01)
*G01R 33/385* (2006.01)
(Continued)

(52) U.S. Cl.
CPC ..... *G01R 33/56341* (2013.01); *G01R 33/385* (2013.01); *G01R 33/543* (2013.01); *G01R 33/5608* (2013.01)

(58) Field of Classification Search
CPC ............ G01R 33/56341; G01R 33/385; G01R 33/5608; G01R 33/543

See application file for complete search history.

(56) References Cited

U.S. PATENT DOCUMENTS 5,539,310 A * 7/1996 Basser ............. G01R 33/56341
324/307
6,288,540 B1    9/2001 Chen et al.
(Continued)

FOREIGN PATENT DOCUMENTS

CN      1653349 A    8/2005
CN      102038502 A  5/2011

OTHER PUBLICATIONS

Kingsley : "Introduction to Diffusion Tensor Imaging Mathematics", Concepts in Magnetic Resonance Part A, , vol. 28, pp. 101-122; (2006).
Tuch, "Q-Ball Imaging", in: Magnetic Resonance in Medicine; 2004; vol. 52; pp. 1358-1372; (2004).
Conturo et. al.; "Encoding of Anisotropic Diffusion with Tetrahedral Gradients: A General Mathematical Diffusion Formalism and Experimental Results", in: Magnetic Resonance in Medicine, vol. 35, pp. 399-412; (1996) O.
(Continued)

*Primary Examiner* — Patrick Assouad
*Assistant Examiner* — Haidong Zhang
(74) *Attorney, Agent, or Firm* — Schiff Hardin LLP

(57) ABSTRACT

In a method and a magnetic resonance apparatus for diffusion-weighted imaging, diffusion gradients for acquiring diffusion-weighted image data, with anisotropic diffusion directions, are determined by defining a space of achievable diffusion gradient vectors as a cuboid, and then defining a spherical shell around the gradient axes in order to determine specific values of the gradient amplitudes. The resulting diffusion gradient vectors have a direct influence on the achievable signal-to-noise ratio of an individual scan, and the method and apparatus enable an advance selection of a desired effective gradient amplitude, and the presentation to a user of candidate diffusion gradient vectors that satisfy the desired requirements.

17 Claims, 5 Drawing Sheets

(51) Int. Cl.
*G01R 33/54* (2006.01)
*G01R 33/56* (2006.01)

(56) References Cited

U.S. PATENT DOCUMENTS

| | | | |
|---|---|---|---|
| 6,969,991 B2 | 11/2005 | Bammer et al. | |
| 8,503,752 B2 | 8/2013 | Feiweier | |
| 2003/0214289 A1 | 11/2003 | van Muiswinkel et al. | |
| 2011/0085722 A1* | 4/2011 | Feiweier | G01R 33/56341 382/131 |
| 2013/0088228 A1* | 4/2013 | Feiweier | G01R 33/4838 324/309 |
| 2015/0253410 A1* | 9/2015 | Warfield | A61B 5/055 324/309 |
| 2017/0322281 A1 | 11/2017 | Feiweier | |
| 2018/0348325 A1 | 12/2018 | Feiweier et al. | |

OTHER PUBLICATIONS

Malyarenko, D.: "Analysis and correction of gradient nonlinearity bias in ADC measurements", Magnetic Resonance in Medicine, vol. 71(3), pp. 1312-1323, (2014).

Wong et. al.: "Optimized Isotropic Diffusion Weighting", in: Magnetic Resonance in Medicine, vol. 34, pp. 139-143; (1995).

Jones, "The Effect of Gradient Sampling Schemes on Measures Derived From Diffusion Tensor MRI: A Monte Carlo Study",: Magnetic Resonance in Medicine; vol. 51, pp. 807-815; (2004).

Basser, et al.: "A Simplified Method to Measure the Diffusion Tensor from Seven MR Images"; in: Magnetic Resonance in Medicine, vol. 39, pp. 928-934; (1998).

Chinese Examination dated Jun. 26, 2019, for Application No. 201710316331.X, and English translation.

* cited by examiner

Prior Art

METHOD AND APPARATUS FOR RECORDING OF DIFFUSION-WEIGHTED MAGNETIC RESONANCE IMAGE DATA WITH ANISOTROPIC DIFFUSION DIRECTIONS

BACKGROUND OF THE INVENTION

Field of the Invention

The invention concerns a method for the determination of diffusion gradients for recording diffusion-weighted magnetic resonance image data with anisotropic diffusion directions. The invention also concerns a method for recording diffusion-weighted magnetic resonance image data of an object under examination, diffusion-gradient-determining computer, and a magnetic resonance system.

Description of the Prior Art

As used herein, "magnetic resonance recordings" should be understood to mean image data from the interior of the object under examination generated with the use of a magnetic resonance scanner controlled during the course of the method, as well as parameter maps reflecting a spatial or temporal distribution of specific parameter values inside the object under examination that can be generated from the image data. A "recording" of magnetic resonance image data should be understood to mean the performance of an image-recording method by the operation of a magnetic resonance imaging system.

Diffusion-weighted magnetic resonance recordings are magnetic resonance recordings with which the diffusion movement of specific substances, in particular water molecules, in the body tissue can be scanned and depicted in a spatially resolved manner. Diffusion imaging has proven effective in everyday clinical practice, in particular for the diagnosis of stroke, since the affected regions of the brain can be recognized much earlier in diffusion-weighted images than is possible in conventional magnetic resonance recordings. In addition, diffusion imaging is being increasingly used in the fields of oncologic, cardiologic and musculoskeletal diseases. One variant of diffusion-weighted magnetic resonance tomography is diffusion tensor imaging with which the dependence on direction of the diffusion is detected. As used herein, diffusion-weighted magnetic resonance recordings include both magnetic resonance recordings generated within the context of diffusion-weighted magnetic resonance tomography methods and magnetic resonance recordings generated within the context of diffusion tensor imaging.

For the generation of diffusion-weighted magnetic resonance recordings, it is first necessary to acquire diffusion-encoded raw data. This done using special scanning sequences, hereinafter called diffusion gradient scanning sequences. These scanning sequences are characterized by, after a customary deflection of the spins into a plane perpendicular to the basic magnetic field of the magnetic resonance tomography scanner, the activation of a specific sequence of gradient magnetic field pulses that vary the field strength of the external magnetic field in a prespecified direction. With a diffusion movement, the precessing nuclear spins move out of phase, and thus can be identified in the measuring signal.

During diffusion imaging, usually, a number of images with different diffusion directions and weightings, i.e. with different diffusion-encoding gradient pulses, are recorded and combined with one another. The degree of the diffusion weighting is generally defined by the so-called diffusion weighting factor, also called the "b-value". The different diffusion images or the images or parameter maps combined therefrom can then be used for the desired diagnostic purposes. In order to be able to assess the influence of the diffusion movement correctly, in many cases a further reference recording in which no diffusion-encoding gradient pulse is activated, i.e. an image with b=0, is used for comparison. The pulse scanning sequence for the acquisition of the reference raw data is structured similarly to the diffusion gradient scanning sequence with the exception of the emission of the diffusion-encoding gradient pulses. Alternatively, it is also possible to perform a reference recording with a b-value ≠0.

For diagnosis, with MR-diffusion imaging, usually images or parameter maps are used with which a free diffusion process is assumed, which is also called a free normal Gaussian diffusion process that has an apparent diffusion coefficient (ADC). This process is characterized by, in dependence on the diffusion-weighting factor, the signal strength drops in accordance with an exponential relationship.

Extensions of this model take account of, for example, the dependence on direction of the diffusion in microscopically limited geometries. For example, water molecules can move along nerve fibers more quickly than perpendicular thereto. The diffusion-tensor model also acquires these relationships under the assumption of a free normal Gaussian diffusion process, which is now direction-independent, and permits the calculation and depiction of associated parameters or parameter values, such as parameters relating to the directional anisotropy.

There is also a series of further approaches with which deviations from Gaussian behavior can be described with corresponding model functions. These include, for example the IVIM model (IVIM=intra-voxel incoherent motion) with which it is assumed there is bi-exponential drop in the signal amplitude in dependence on the b-value due to perfusion effects. This class of approaches also includes the Kurtosis model with which deviations from the exponential dependence of the signal strength are modeled from the b-value with higher-order tensors.

The acquisition of a number of diffusion directions and/or weightings enables a more precise image of the local diffusion geometry to be obtained. In this way, HARDI (high angular resolution diffusion imaging), DSI (diffusion spectrum imaging) or Q-Ball methods (see David S. Tuch, "Q-Ball Imaging", Magnetic Resonance in Medicine 52:1358-1372 (2004)) enable a number of preferred directions to be resolved with an image voxel.

There are also methods with which the dependence of the signal intensity is taken account of experimentally not only by the b-value and the direction, but also by specific interval durations in order to use model assumptions to draw conclusions relating to microscopic tissue parameters (for example the axon radius, the surface-to-volume ratios etc.).

The last mentioned group of methods offers the possibility of generating new diffusion-based contrasts possibly with a high clinical value.

When recording diffusion data by diffusion-weighted magnetic resonance imaging, the available gradient amplitude G represents a central performance feature. This is because the greater the gradient amplitude, the shorter the time required to implement a prespecified diffusion weighting. This can be identified from the Stejskal-Tanner equation:

$$b = \gamma^2 G^2 \tau^2 (\Delta - \tau/3). \tag{1}$$

Here, $\gamma$ is the gyromagnetic ratio, $\tau$ is the duration of each of the other two (ideally assumed to be rectangular) diffusion gradients and $\Delta$ is the temporal spacing of the diffusion gradients. If, for example, the gradient G is doubled, under the assumption that the gradient duration $\tau$ remains unchanged, the effective duration $T=\Delta-\tau/3$ can be reduced to a quarter if the b-value is to remain the same. The term "a quarter" applies approximately if the value of the temporal spacing of the diffusion gradients $\Delta$ is high compared to the value of the gradient duration $\tau$. FIG. 1 illustrates a Stejskal-Tanner sequence for diffusion-weighted magnetic resonance imaging.

Therefore, the gradient amplitude G has a direct influence on the achievable signal-to-noise ratio (SNR) of an individual scan. This is because, with a shortened diffusion encoding time, it is possible to reduce relaxation influences, for example by a reduction in the echo time which is then possible. The SNR gain can, for example, be used to improve image quality, to reduce scanning time or increase resolution.

In order to make optimum use of the maximum gradient amplitude of a system available for each physical axis available, pulses usually are applied to several axes simultaneously. In this context, the decisive factor for the diffusion encoding is the vector sum of the amplitude of the effective gradient $G_{eff}=\sqrt{G_x^2+G_y^2+G_z^2}$, which can be up to $\sqrt{3}$ higher than the amplitudes of the individual axes $G_x$, $G_y$, $G_z$.

During an isotropic diffusion process with which no direction is indicated, in principle, scanning with one diffusion direction is sufficient. In this case, it is possible to select the gradient amplitudes $G_x=G_y=G_z=G_{max}$ and obtain $G_{eff}=G_{max}*\sqrt{3}$ as the effective gradient, i.e. the maximal possible performance. However, in tissue types with pronounced anisotropies, such as, for example, nerve or muscle fibers, this approach produces undefined results, since the diffusion weighting is dependent upon the a priori unknown relative alignment between the tissue and the gradients' coordinate system.

In addition, during the determination of specific diffusion coefficients, such as, for example, trace-weighting, derived diffusion coefficients ADC or tensor variables, such as, for example, fractional anisotropy, diffusion-weighted image recordings with several diffusion directions are required for which defined boundary conditions have to be satisfied. As a rule, the additional boundary conditions significantly limit the possibilities for simultaneous application to several axes.

For the quantification of an anisotropic diffusion process, for example in the form of a trace coefficient, the recording of at least three non-collinear diffusion directions is required. Suitable direction sets are, for example:

orthogonal: $(G_x, G_y, G_z)=(1, 0, 0), (0, 1, 0), (0, 1, 0)$,
with this direction set: $G_{eff}=G_{max}$;
optimized orthogonal: $(G_x, G_y, G_z)=(1, 1, -1/2), (1, -1/2, 1), (-1/2, 1, 1)$,
with this direction set:

$$G_{eff} = G_{max} * \sqrt{\frac{9}{4}};$$

tetrahedral: $(G_x, G_y, G_z)=(-1, 1, 1), (1, -1, 1), (-1, -1, -1), (1, 1, -1)$,
with this direction set: $G_{eff}=G_{max}*\sqrt{3}$;

octahedral: $(G_x, G_y, G_z)=(1, 0, 1), (-1, 0, 1), (0, 1, 1), (0, 1, -1), (0, 1, -1), (1, 1, 0), (-1, 1, 0)$,
with this direction set: $G_{eff}=G_{max}*\sqrt{2}$.

Although the tetrahedral direction set has the maximum performance, it is not possible to determine tensor data with this set.

The octahedral direction set can be used to determine tensor data because it contains six non-collinear directions, distributed isotropically in space. This simultaneously entails the conventional tensor-suitable direction set with the highest known effective gradient amplitude $G_{eff}$.

The direction sets known in the prior art with a larger number of directions all have smaller effective amplitudes, which, in borderline cases of a very high number of directions, lead to an isotropic distribution of a unit sphere with an effective amplitude $G_{eff}=G_{max}$.

SUMMARY OF THE INVENTION

An object of the present invention is to provide a method for recording diffusion-weighted magnetic resonance image data with anisotropic diffusion directions and a control facility for a magnetic resonance system suitable for such recording, with which the best possible performance is achieved.

In the method according to the invention for the determination of diffusion gradients for a recording of diffusion-weighted magnetic resonance image data with anisotropic diffusion directions, first, a space of achievable diffusion gradient vectors is defined as a cuboid oriented along the physical gradient axes of a gradient system of a magnetic resonance system to be used for the subsequent recording and with an extension of the edges of the cuboid corresponding to the maximum gradient amplitudes of the gradients in the direction of the physical gradient axes of the gradient system. A gradient system of a magnetic resonance scanner usually is composed of multiple gradient coils for the generation of gradient fields in different spatial directions. In addition to this, a value interval for an effective gradient amplitude with a minimum value and a maximum value for the effective gradient amplitude is defined. Subsequently, a spherical shell around the origin of the physical gradient axes with an inside radius with the minimum value and an outside radius with the maximum value is determined. Also determined are the subregions of the spherical shell lying inside the cuboid as end points of possible candidate origin vectors. Finally, a set of at least six diffusion gradient vectors, which additionally meet the directional constraints for tensors, are selected from the set of candidate origin vectors. In this context, the directional condition for tensors should be understood to be conditions for the orientation of the diffusion gradient vectors the consideration of which enables the calculation of a diffusion tensor on the basis of the selected diffusion gradient vectors.

Since the gradient amplitudes used for the generation of the diffusion gradient vectors have a direct influence on the achievable signal-to-noise ratio of an individual scan, it is particularly advantageous for the effective gradient amplitudes to be as high as possible. The method according to the invention enables the advance selection of a desired effective gradient amplitude and then supplies possible diffusion gradient vectors to be used. Advantageously, due to the shorter diffusion encoding time, the greater effective gradient amplitude enables relaxation influences to be reduced, for example by a reduction in the echo time TE which is then possible. The gain with signal-to-noise ratio can be used to improve the image quality, reduce the scanning time, or to increase the resolution of the diffusion images.

With the method according to the invention for recording diffusion-weighted magnetic resonance image data of an object under examination, first, a set of diffusion gradient vectors is determined with the use of the aforementioned method according to the invention for the determination of diffusion gradients for a recording of diffusion-weighted magnetic resonance image data with anisotropic diffusion directions. This is followed by the acquisition of diffusion-encoded raw data by execution of a diffusion-encoding gradient-pulse sequence, also known as a diffusion gradient scanning sequence that includes the diffusion gradient vectors determined. Finally, diffusion-encoded image data are reconstructed on the basis of the diffusion-encoded raw data and diffusion behavior is determined on the basis of the diffusion-encoded image data. During the reconstruction, it is possible to employ customary methods used in magnetic resonance imaging for the transformation of raw data into the image domain, for example based on a Fourier transform.

A diffusion-gradient-determining computer according to the invention has an input interface for receiving maximum gradient amplitudes of the gradients in the direction of the physical gradient axes of a gradient system of a magnetic resonance scanner, wherein the maximum gradient amplitudes define the space of achievable diffusion gradient vectors as a cuboid oriented along the physical gradient axes with an extent corresponding to the length of the edges of the cuboid. The input interface is also used for the reception of a selected value range for an effective gradient amplitude with a minimum value and a maximum value for the effective gradient amplitude.

The diffusion-gradient-determining computer according to the invention also has a spherical-shell-determining processor for the determination of a spherical shell around the origin of the physical gradient axes with an inside radius with the minimum value and an outside radius with the maximum value. In addition, part of the diffusion-gradient-determining computer according to the invention is a sub-region-determining processor for the determination of the subregions of the spherical shell lying inside the cuboid as end points of possible candidate origin vectors. The diffusion-gradient-determining computer according to the invention also has a selecting processor for selecting a set of at least six diffusion gradient vectors, which additionally meet the directional constraints for tensors, from the set of candidate origin vectors. The diffusion-gradient-deteunining computer according to the invention also has an output interface, at which one or more of the set of at least six selected diffusion gradient vectors is presented to a user.

The magnetic resonance apparatus according to the invention has a magnetic resonance data acquisition scanner, with a patient opening therein adapted to receive a patient for acquiring diffusion-weighted MR data therefrom. In addition to a basic field magnet system, with which a basic field magnet field is produced in the usual way in the patient scanning space, the scanner of the MR apparatus according to the invention must have a transmitting antenna with a radio-frequency transmission facility, a gradient system having a number of gradient coils with a gradient system interface, a receiving antenna with a radio-frequency receiving facility, and a diffusion-gradient-determining computer according to the invention.

The diffusion-gradient-determining computer according to the invention is preferably implemented in the form of software on a suitable programmable control computer of a magnetic resonance system with corresponding storage capability. The radio-frequency transmission facility, the gradient system interface and the radio-frequency receiving facility can also be implemented, at least partially, in the form of software units, with other parts of these components being pure hardware units, for example a radio-frequency amplifier, a radio-frequency generator, a gradient-pulse generator of the gradient system interface, or an analog/digital converter of the radio-frequency receiving facility, etc. An extensively software-based implementation, in particular of the above-named units, has the advantage that it is also possible to retrofit magnetic resonance system control systems used to date in a simple way by a software update in order to operate according to the invention.

The present invention also encompasses a non-transitory, computer-readable data storage medium encoded with programming instructions that, when the storage medium is loaded into a memory of a control computer of an MR apparatus, cause the control computer to operate the MR apparatus in the manner described above, in order to implement the method according to the invention by execution of the programming instructions.

The computer-readable data storage medium can be, for example, a memory stick, a hard disk or another transportable or permanently installed data medium on which the program code is stored. The computer can, for example, have one or more interacting microprocessors or the like.

Different features of different exemplary embodiments can be combined to foitu further exemplary embodiments.

In a preferred embodiment of the method according to the invention, the directional constraints for tensors are as follows:
no two diffusion gradient vectors are parallel or antiparallel,
if three diffusion gradient vectors are coplanar, the other three must be linearly independent,
no four diffusion gradient vectors may be coplanar.

The described rule, established by Kingsley (see below), signifies the lowest possible restriction for the selection of the diffusion gradient vectors and gives the user the greatest possible freedom in the selection of the gradient vectors. For example, this provides the option of defining the diffusion gradient vectors in accordance with specific selected diffusion directions. A detailed treatment of directional constraints is described in Peter B. Kingsley "Introduction to diffusion Tensor Imaging Mathematics: Part I. Tensors, Rotations and Eigenvectors", Concepts in Magnetic Resonance Part A, Vol. 28 A(2), 101-122 (2006), published by Wiley InterScience.

The method according to the invention enables the directions for a set of diffusion gradient vectors to be selected anisotropically such that they extend along preferred directions of diffusion in specific tissue structures to be examined. In this context, a higher effective gradient amplitude of the diffusion gradient vectors determined is achieved than is conventionally the case.

In another embodiment of the method according to the invention, the minimum value for the effective gradient amplitude is defined so as to be larger than $\sqrt{2}$ times the smallest of the maximum gradient amplitudes, and the maximum value for the effective gradient amplitude is defined so as to be smaller than $\sqrt{3}$ times the largest of the maximum gradient amplitudes on the individual physical axes.

This definition achieves effective gradient amplitudes for diffusion gradient vectors for the determination of tensor data that are larger than those achieved in the prior art, which do not exceed $\sqrt{2}$ times the maximum gradient amplitudes on the individual physical axes.

In another embodiment of the method according to the invention, the cuboid of the space of achievable diffusion gradient vectors is a cube and the maximum gradient amplitudes in the x-, y- and z-directions each have the same value. Often, the hardware that is used causes the gradient coils to have the same maximum gradient amplitude so that the space of achievable diffusion gradient vectors can be assumed to be a cube.

In a further embodiment of the method according to the invention, the value range for an effective gradient amplitude converges toward a limit value of an effective gradient amplitude, so that the minimum value and the maximum value for the effective gradient amplitude are the same as the limit value, and the spherical shell is a spherical surface. Therefore, instead of a range, a specific value is defined for the effective gradient amplitude. With this variant, then the surface segments of the spherical surface lying inside the cuboid are determined as end points of possible candidate origin vectors. Although with this variant the degree of freedom with the choice of diffusion gradient vectors is not as large as when a value range is used for the effective gradient amplitude, this is balanced by the fact that, with this variant, the effective gradient amplitude of the diffusion gradient vectors does not vary so that the b-value also does not vary, thus permitting greater precision with the measurement of the diffusion behavior. As noted, with diffusion imaging, the image contrast changes with the b-value. Therefore, with an unchanged b-value, the diffusion-weighted base images have a more homogenous contrast than is the case with a variation of the b-value.

This becomes particularly relevant as soon as the domain of the Gaussian diffusion processes is exited. For example, with the IVIM-method, the dependence of the diffusion contrast on the b-value is explicitly analyzed: in this case, all images relevant for the calculation, for example of a trace weighting, have a very similar b-value.

Preferably, with the variant described, the effective gradient amplitude is selected larger than $\sqrt{2}$ times the maximum gradient amplitude and smaller than $\sqrt{3}$ times the maximum gradient amplitudes, so that the signal-to-noise ratio is improved compared to the prior art.

In another embodiment of the method according to the invention the value selected for the effective gradient amplitude is the value of $$\sqrt{\frac{9}{4}}$$

times the maximum gradient amplitudes and the diffusion gradient vector set takes the following form:

$(G_x, G_y, G_z)=[(1, 1, -1/2), (1, -1/2, 1), (-1/2, 1, 1),$
$(1, 1, 1/2), (1, 1/2, 1), (1/2, 1, 1)]*G_{max}.$ This set of diffusion gradient vectors is suitable for calculating the tensor data. It enables a higher effective gradient amplitude than is conventionally the case, and is approximately isotropic. In this context, the quality of the set of vectors does not change due to the inversion of individual vectors. Instead, an inversion of this kind permits more homogeneous scanning of positive and negative vector components on all axes.

The last-described embodiment represents special case of a choice of six or more vectors from the following group of vectors:

$(G_x, G_y, G_z)=[(1, 1, 1/2), (1, 1, -1/2), (1, -1, 1/2),$
$(1, -1, -1/2), (1, 1/2, 1), (1, -1/2, 1), (1, 1/2,$
$-1), (1, -1/2-1), (1/2, 1, 1), (1/2, -1, 1), (1/2,$
$1, -1), (1/2, -1, -1)]*G_{max}.$ The inversion of individual vectors is also additionally possible in this more general variant (i.e. in total, there are 24 direction vectors available for selection).

In another embodiment of the method according to the invention, the directions of the selected diffusion gradient vectors are defined dependent on a defined and known anisotropy in the diffusion in a region to be examined. In this context, preferably, the orientation of the selected diffusion gradient vectors is selected so that they extend parallel or perpendicular to a preferred orientation of tissue structures in the region to be examined. Preferably, the diffusion gradient vectors extend in the directions in which a diffusion is to be expected due to the special boundary conditions in the structures to be examined so that the diffusion component in the image contrast is particularly high.

In another embodiment of the method according to the invention, the determination of the diffusion gradient vectors is perfoinied for trace-weighted diffusion quantification. Conventionally, with pure trace-weighted diffusion quantification, the use of four diffusion gradient vectors is sufficient so that the diffusion encoding can already be performed with maximum performance. However, in order to later also correct non-linearities of the gradient system, for example, it is necessary for trace-images to be generated on the basis of a tensor evaluation from which the trace-weighted data can be determined. This enables trace-weighted data and also data derived therefrom, such as ADC-data, to be calculated correctly for any tissue anisotropies at any position. In these cases, a tensor calculation is performed using spatially-dependent b-value matrices. A method for the determination of such tensors taking account of non-linearities is described in U.S. Pat. No. 6,969,991 B2.

Advantageously, it is now possible to use the method according to the invention for the determination of diffusion gradients for a recording of diffusion-weighted magnetic resonance image data with anisotropic diffusion directions in order to determine anisotropic direction sets or diffusion gradient vectors for the tensor determination with an effective gradient amplitude, with a higher performance than that in the prior art. Since in this special embodiment only the trace-information, and no directional variable, from the calculated diffusion tensor is relevant, due to the non-isotropic diffusion directions, any directional preference that may be present plays only a small role. Although, the method according to the invention ultimately results in an anisotropic directional distribution, it is advisable or advantageous for the directions nevertheless to be chosen—within the specified limits—as isotropically as possible.

For example, this can be implemented by means of a repulsion approach described in "The Effect of Gradient Sampling Schemes on Measures Derived From diffusion Tensor MRI: A Monte Carlo Study", Magnetic Resonance in Medicine 51:807-815 (2004). With this approach, first, N (at least 6) directions are arbitrarily selected and then displaced in an iterative method until the "repulsion energy" is minimized, at least locally.

This approach can be transferred to the method according to the invention, wherein then the achievable directions are correspondingly restricted.

In this case, it also possible for sets of diffusion gradient vectors for diffusion tensors with different b-values to be calculated in order also to be able to use more complex diffusion models, such as the IVIM method noted above, in order to take account of perfusion components.

With this variant, it is possible to choose isotropic direction vectors for the smaller b-values (i.e. small diffusion gradient amplitudes), and use only anisotropic directions according to the invention with the high b-values. Depending upon the application, however, it is also possible to use the same anisotropic directions alternatively for large and small b-values (which are then determined by the large b-values).

The method according to the invention for the determination of diffusion gradients for a recording of diffusion-weighted magnetic resonance image data with anisotropic diffusion directions can also be used with more complex diffusion models that place specific requirements on the diffusion directions, and therefore also require recording in at least six directions, which meet the above-named conditions. For example, this includes higher-order tensor models, HARDI models, and Q-Ball models.

In another embodiment of the method according to the invention, a non-linearity of a gradient system used to generate the diffusion gradients is taken into account during the determination of diffusion behavior.

The purpose of this embodiment is to achieve trace-weighted diffusion quantification with non-linearity correction. A suitable method for this, which is performed on the basis of a tensor determination, is described in U.S. Pat. No. 6,969,991 B2. One restriction to note is the use of isotropic diffusion directions: hence, the gradient amplitude is limited to $\sqrt{2}*G_{max}$, resulting in longer gradient pluses and hence in a longer echo time and hence in a lower signal/noise ratio.

With this variant, higher gradient amplitudes, and hence shorter gradient pulses, hence shorter echo times, and hence a higher signal/noise ratio, are achieved.

In another embodiment, at least 6 directions are chosen in order to carry out a tensor evaluation taking into account the local b-Matrix (according to U.S. Pat. No. 6,969,991 B2) and to reconstruct trace-weighted images therefrom, for example.

DESCRIPTION OF THE PREFERRED EMBODIMENTS

Figure 1:
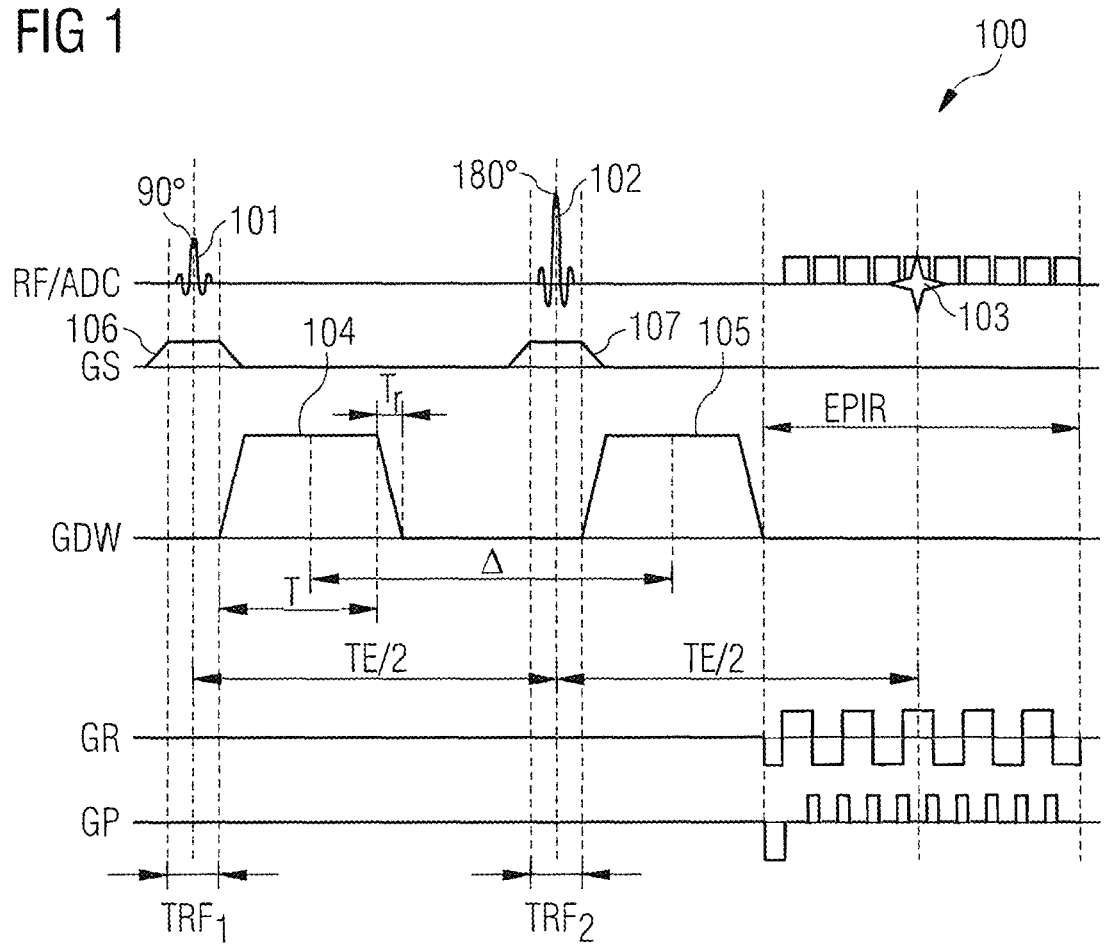
FIG. 1 is a pulse diagram for a Stejskal-Tanner experiment for diffusion-weighted imaging.

FIG. 1 shows a Stejskal-Tanner sequence 100. This is by far the most important diffusion-weighted pulse sequence. The first line of the graph, which is identified with RF/ADC, shows an RF excitation pulse 101 with a duration $TRF_1$, which is radiated at the start of a pulse sequence simultaneously with activation of a slice selection gradient 106 (see second line GS) and an RF refocusing pulse 102 with a duration $TRF_2$, which is radiated between two diffusion contrast gradient pulses 104, 105 (see third line GDW) and with which a slice selection gradient 107 is also activated at the same time (see second line GS). The gradient pulses 104, 105 have the same polarity, and usually the same amplitude and duration. The RF refocusing pulse 102 forms a spin echo 103 (see first line), which, in the example shown, is read out with an EPI echo readout train EPIR having a number of readout windows. Furthermore, in the diagram in FIG. 1, the second line from the bottom shows a gradient sequence GR in the readout direction (frequency encoding direction) and the lowest line shows a gradient sequence GP in the phase encoding direction.

The echo time TE is the time between the RF excitation pulse 101 and the echo 103. The formation of the echo is obtained from the vanishing moment of all the activated gradients along the three axes. The position of the refocusing pulses is preferably selected at TE/2 in order also to compensate the moments generated by static magnetic field gradients that cannot be influenced (for example due to B0 inhomogeneities in the object) precisely at the echo time point.

For the Stejskal-Tanner sequence shown in FIG. 1 with symmetrical trapezoidal diffusion gradients 104, 105 with the amplitude G and a vanishing ramp time $T_r$, the following is obtained for the b-value:

$$b=\gamma^2 G^2[\tau^2(\Delta-\tau/3)]. \qquad (2)$$

Here, τ is the duration of a gradient and Δ is the time that passes between the activation durations of the two gradient pulses 104, 105, i.e. the temporal spacing between these gradient pulses 104, 105. The above-defined time intervals are shown in FIG. 1. G is the gradient strength or gradient amplitude of the diffusion gradients 104, 105. The constant γ is the gyromagnetic ratio. Equation 2 only takes account of the contribution of the idealized diffusion-contrast gradient 104 and 105 for the b-value of the sequence.

Instead of the Stejskal-Tanner sequence 100 shown in FIG. 1, it is also possible to use other diffusions sequences for diffusion-weighted magnetic resonance imaging.

Figure 2:
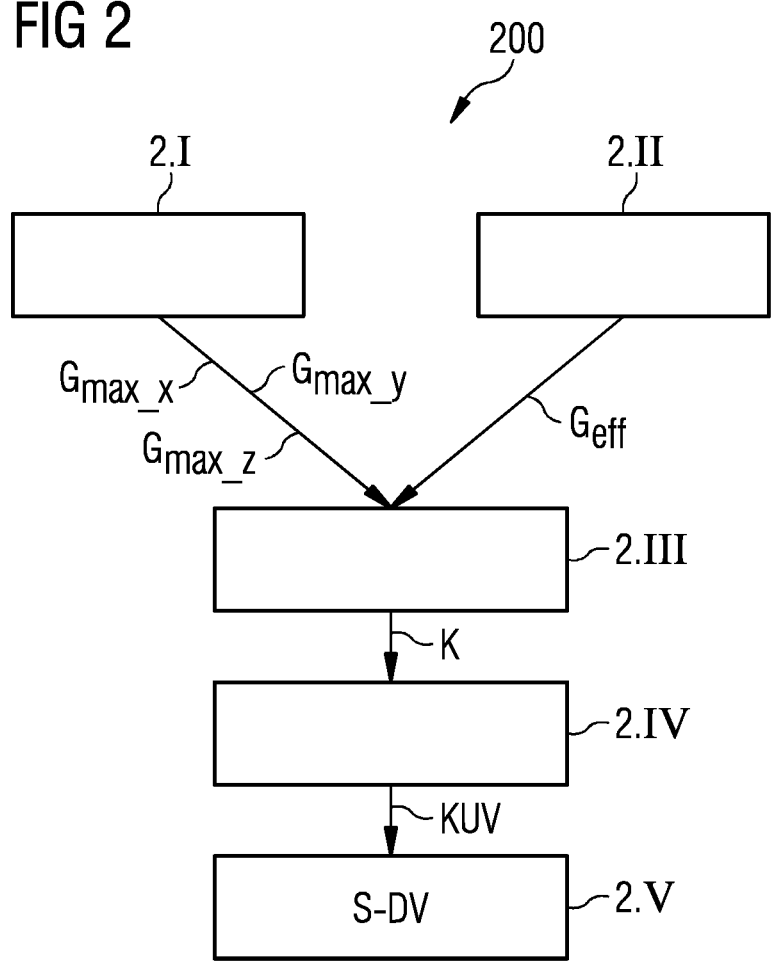
FIG. 2 is a flowchart with the basic steps of a method for the determination of diffusion gradients for a recording of diffusion-weighted magnetic resonance image data with anisotropic diffusion directions, according to an exemplary embodiment of the invention.

FIG. 2 shows a flowchart 200 illustrating a method for the determination of diffusion gradients for a recording of diffusion-weighted magnetic resonance image data with anisotropic diffusion directions, according to an exemplary embodiment of the invention. In Step 2.I, information relating to the maximum gradient amplitudes $G_{max\_x}$, $G_{max\_y}$, $G_{max\_z}$ of the gradients in the direction of the physical gradient axes Gx, Gy, Gz is determined. These gradient amplitudes are obtained from the maximum performance of the gradient coils of a magnetic resonance imaging system and are typically derived from the system specifications for the device in question. These maximum gradient amplitudes $G_{max\_x}$, $G_{max\_y}$, $G_{max\_z}$ define a space of achievable diffusion gradient vectors as a cuboid oriented along the physical gradient axes Gx, Gy, Gz, with an extent of the edges of the cuboid corresponding to the maximum gradient amplitudes $+/-G_{max\_x}$, $+/-G_{max\_y}$, $+/-G_{max\_z}$ of the gradients in the direction of the physical gradient axes Gx, Gy, Gz. In Step 2.II, a value for an effective gradient amplitude $G_{eff}$ is defined. With a later selection of six diffusion gradient vectors, this value should be advantageously be selected such that the effective gradient amplitude $G_{eff}$ is greater than $\sqrt{2}$ times the smallest value of the maximum gradient amplitudes $G_{max\_x}$, $G_{max\_y}$, $G_{max\_z}$ and is smaller than the $\sqrt{3}$ times the maximum variables of the maximum gradient amplitudes $G_{max\_x}$, $G_{max\_y}$, $G_{max\_z}$.

If it is desired to take account of more than six directions (i.e. to select more than six diffusion gradient vectors), conventionally only isotropic direction sets with scaling factors $<\sqrt{2}$ are known (with a very large number of directions, the scaling factor=1). In this case, the method according to the invention offers the possibility of determining a corresponding number of optimized anisotropic directions. With this variant, diffusion gradient vectors with scaling factors $<\sqrt{2}$ also offer an advantage compared to the prior art.

On the basis of the selected value of the effective gradient amplitude $G_{eff}$, in Step 2.III a sphere K is determined around the origin of the physical gradient axes Gx, Gy, Gz with a radius with a value corresponding to the value of the effective gradient amplitude $G_{eff}$. In Step 2.IV, the sections of the spherical surface KOF of the sphere K lying inside the cuboid are determined as end points of possible candidate origin vectors KUV. In Step 2.V, from the set of candidate origin vectors KUV, a set S-DV of at least six diffusion gradient vectors DV is selected, which additionally meet the directional constraints, preferably according to Kingsley, for the determination of tensors on the basis of the diffusion gradient vectors DV and simultaneously have the lowest possible anisotropy.

The set S-DV of diffusion gradient vectors DV determined can now be played out in the context of a method for recording diffusion-weighted magnetic resonance image data of an object under examination O. During a diffusion-weighted magnetic resonance imaging method of this kind, diffusion-encoded raw data is acquired by a diffusion-encoding gradient-pulse sequence that includes the determined diffusion gradient vectors. This diffusion-encoding gradient-pulse sequence can have the shape shown in FIG. 1, for example, wherein, for simplicity, the diffusion gradient GDW illustrates only one dimension of the physical gradient axes Gx, Gy, Gz. The diffusion-encoded raw data acquired is used as the basis for the reconstruction of diffusion-encoded image data. Subsequently, diffusion behavior is determined on the basis of the diffusion-encoded image data.

Figure 3:
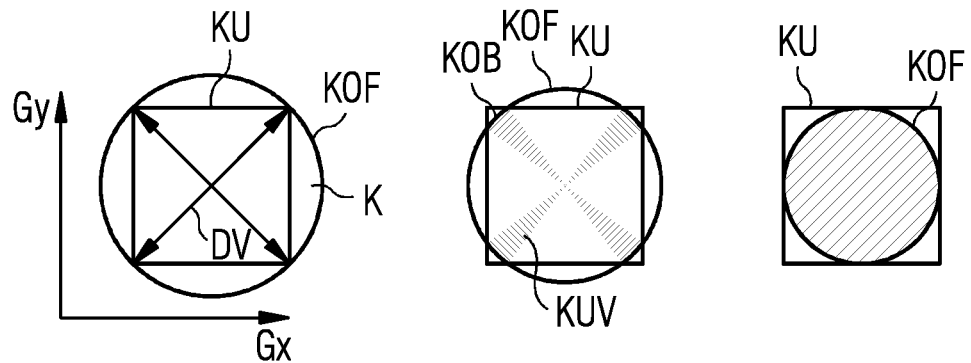
FIG. 3 shows a projection of a cube depicting the space of achievable diffusion gradient vectors and a spherical surface intersecting the cube, wherein the radius of the associated sphere corresponds to the value of an effective gradient amplitude.

FIG. 3 depicts for purposes of illustration a projection of a cube KU depicting the space of achievable diffusion gradient vectors DV and a spherical surface KOF intersecting the cube KU on the Gx plane. Half the edge length of the cube K corresponds exactly to a maximum gradient amplitude $G_{max}$. Therefore, in the examples shown in FIG. 3, the maximum values $G_{max}$ of the gradient amplitude are the same on all the physical gradient axes Gx, Gy, Gz. In this context, the radius of the associated sphere K corresponds to the value of a selected effective gradient amplitude $G_{eff}$.

In the left detail drawing in FIG. 3, the spherical surface KOF of the sphere K intersects the cube KU exactly at its corners. I.e., in this example, the value of the selected effective gradient amplitude $G_{eff}$ corresponds to $\sqrt{3}$ times the maximum value $G_{max}$ of the gradient amplitude on all the physical gradient axes Gx, Gy, Gz. Possible diffusion gradient vectors DV correspond to the points of intersection at the corners of the cube KU. However, in this example, only four non-collinear diffusion gradient vectors DV are possible so that a tensor calculation is not possible since this requires at least six diffusion gradient vectors DV corresponding to said directional constraints for the diffusion gradient vectors DV.

In the middle detail drawing in FIG. 3, a smaller value than $\sqrt{3}$ times the maximum value $G_{max}$ of the gradient amplitude on all the physical gradient axes Gx, Gy, Gz but a higher value than $\sqrt{2}$ times the maximum value $G_{max}$ of the gradient amplitude on all the physical gradient axes Gx, Gy, Gz was selected for the effective gradient amplitude $G_{eff}$. There are now spherical surface regions KOB of the spherical surface KOF of the sphere K lying inside the cube KU. These spherical surface regions KOB form the end points of possible candidate origin vectors KUV for diffusion gradient vectors DV. In this example, there are numerous possibilities for the definition of diffusion gradient vectors DV, which are suitable for the tensor calculation and nevertheless have an effective gradient amplitude $G_{eff}$, which is greater than the conventionally achievable $\sqrt{2}$ times the maximum value $G_{max}$ of the gradient amplitude.

In the example, shown in the right detail drawing in FIG. 3, the value chosen for the effective gradient amplitude $G_{eff}$ was a value corresponding to the maximum value $G_{max}$ of the gradient amplitude on all the physical gradient axes Gx, Gy, Gz. In this example, all the points of the spherical surface KOF lie inside the cube KU. Therefore, in this example, there is no restriction relating to the direction of possible candidate origin vectors KUV for diffusion gradient vectors DV. Accordingly, the selection of the directions of the diffusion gradient vectors DV is only restricted by the directional constraints for the diffusion gradient vectors DV that have already been mentioned several times above. However, the diffusion gradient vectors DV determined in this way, which are suitable for the tensor calculation, only have an effective gradient amplitude $G_{eff}$ corresponding to the maximum value $G_{max}$ of the gradient amplitude on the physical gradient axes Gx, Gy, Gz. This is below the conventionally achievable value of $\sqrt{2}$ times the maximum value $G_{max}$ of the gradient amplitude on all the physical gradient axes Gx, Gy, Gz.

The procedure illustrated in the middle detail drawing in FIG. 3 corresponds to an exemplary embodiment of the method according to the invention for the determination of diffusion gradients for a recording of diffusion-weighted magnetic resonance image data with anisotropic diffusion directions.

Figure 4:
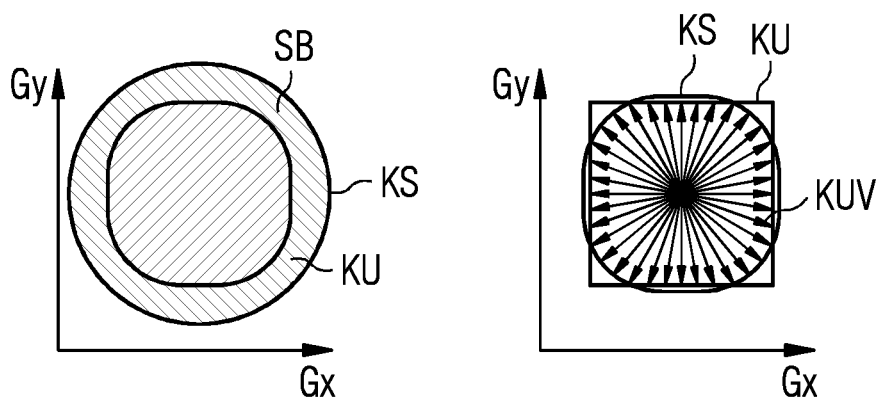
FIG. 4 shows a projection of a cube depicting the space of achievable diffusion gradient vectors and a spherical shell intersecting the cube, wherein the spherical shell represents possible values of effective gradient amplitudes.

In FIG. 4, the left detail drawing illustrates a projection of a cube KU depicting the space of achievable diffusion gradient vectors DV and a spherical shell KS intersecting said cube KU, wherein the spherical shell KS represents possible values of effective gradient amplitudes $G_{eff}$. Compared to the variant illustrated in the middle detail drawing in FIG. 3, with this variant, a greater degree of freedom of the selectable candidate origin vectors KUV is obtained, wherein a slight variation in the b-value for different directions is accepted.

In FIG. 4, the regions SB of the part of the spherical shell KS lying inside the cube KU now define end points of possible candidate origin vectors KUV. With the exemplary embodiment shown in FIG. 4, the outer surface of the spherical shell KS intersects the corners of the cube KU. If the possible candidate origin vectors KUV were not restricted to the outer surface of the spherical shell KS, as with the example of the left detail drawing in FIG. 3, only four permitted diffusion gradient vectors DV would result so that a tensor calculation would not be possible. However, due to the thickness of the spherical shell KS, candidate origin vectors KUV with a slightly lower gradient amplitude are also now permitted, thus enabling a higher number of diffusion gradient vectors DV, so that a tensor calculation is possible without problems with the exemplary embodiment shown in FIG. 4. While the outer surface of the spherical shell KS corresponds to a predetermined maximum value $G_{eff\_max}$ of an effective gradient amplitude, the inner surface of the spherical shell KS corresponds to a predetermined minimum value $G_{eff\_min}$ of an effective gradient amplitude, which is, however, larger than is the case with conventional diffusion gradient sets. Therefore, candidate origin vectors from the spherical shell KS enable the selection of diffusion gradient vectors with an effective gradient amplitude, which is greater than is the case with conventional diffusion gradient sets. Therefore, compared to the prior art, a higher value is achieved for the effective gradient amplitude of the diffusion gradient vectors DV determined.

As mentioned, this is associated with advantages relating to the achievable signal-to-noise ratio SNR of an individual scan. This is because, with a shortened diffusion encoding time, relaxation influences can, for example be reduced by a reduction in the echo time TE which is then possible. Also as mentioned, the SNR gain can be used to improve the image quality, to reduce the scanning time or to increase the resolution.

The right detail drawing in FIG. 4 shows a number of possible candidate origin vectors KUV, which can be used for the determination of suitable diffusion gradient vectors.

Figure 5:
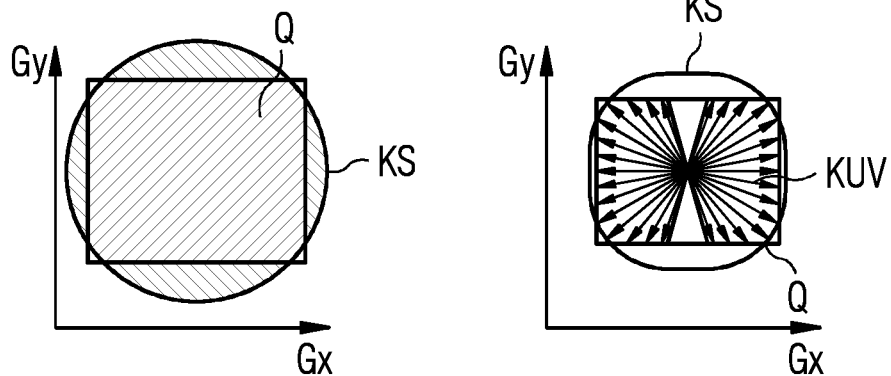
FIG. 5 shows a projection of a cuboid depicting the space of achievable diffusion gradient vectors and a spherical shell intersecting the cube, wherein the spherical shell represents possible values of effective gradient amplitudes.

In FIG. 5, the left detail drawing of a cuboid Q depicts a projection of the space of achievable diffusion gradient vectors DV and a spherical shell KS intersecting said cube KU. With this exemplary embodiment, therefore, the values of the maximum gradient amplitudes on the physical gradient axes Gx, Gy, Gz are different. Once again, with this exemplary embodiment, the spherical shell KS represents possible values of effective gradient amplitudes. With this variant, there is also a greater degree of freedom of the selectable candidate origin vectors KUV, wherein a slight variation in the b-value for different directions is accepted. In the exemplary embodiment shown in FIG. 5, the regions of the part of the spherical shell KS lying inside the cuboid Q now define end points of possible candidate origin vectors KUV.

In the exemplary embodiment shown in FIG. 5, the value of the maximum gradient amplitude $G_{max\_x}$ on the physical gradient-x-axis Gx was selected slightly higher than is the case with the exemplary embodiment shown in FIG. 4 hence resulting in the cuboidal or rectangular shape of the cuboid Q shown in FIG. 5 depicting the space of achievable diffusion gradient vectors. In the exemplary embodiment shown in FIG. 5, the outer radius of the spherical shell KS corresponds to a predetermined maximum value $G_{eff\_max}$ of the effective gradient amplitude. The inner radius of the spherical shell KS corresponds to a predetermined minimum value $G_{eff\_min}$ of the effective gradient amplitude.

In FIG. 5, the right detail drawing shows a number of possible candidate origin vectors KUV, which can be used for the determination of suitable diffusion gradient vectors.

In this context, it is noticeable that, due to the rectangular or cuboidal shape of the region Q forming the space of achievable diffusion gradient vectors and the selection of the minimum value of the effective gradient amplitude, now not all directions are available for the formation of diffusion gradient vectors.

Figure 6:
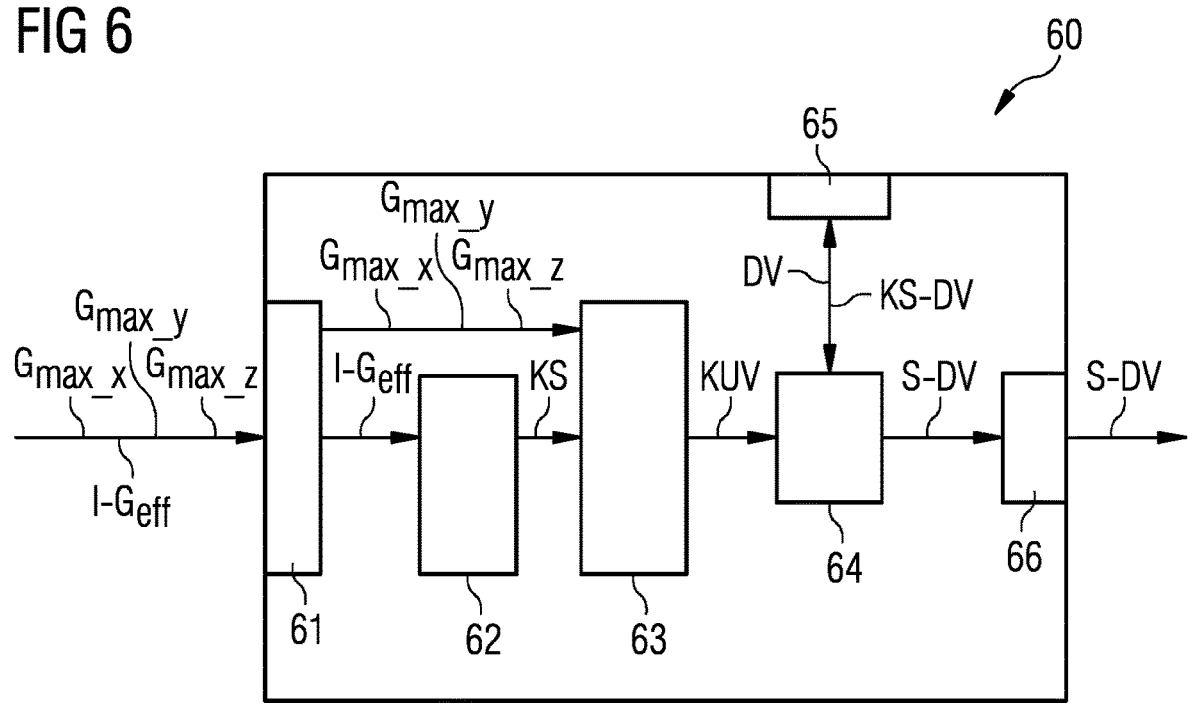
FIG. 6 is a block diagram illustrating a diffusion-gradient-determining computer according to an exemplary embodiment of the invention.

FIG. 6 illustrates a diffusion-gradient-determining computer 60 according to an exemplary embodiment of the invention. For example, this can be part of a control computer 13 (see FIG. 7) of a magnetic resonance apparatus 1 (see FIG. 7). The diffusion-gradient-determining computer 60 has an input interface 61, which receives information relating to the maximum gradient amplitudes $G_{max\_x}$, $G_{max\_y}$, $G_{max\_z}$ of the gradients in the direction of the physical gradient axes Gx, Gy, Gz. The maximum gradient amplitudes $G_{max\_x}$, $G_{max\_y}$, $G_{max\_z}$ define the space of achievable diffusion gradient vectors as a cuboid oriented parallel to the physical gradient axes Gx, Gy, Gz, with an extension of the edges of the cuboid corresponding to the values of the gradient amplitudes $G_{max\_x}$, $G_{max\_y}$, $G_{max\_z}$. This information can typically be derived from the system specification and can, for example, be entered by a user or be transmitted automatically to the diffusion-gradient-determining computer 60 or, alternatively, may already be known by the computer 60.

The input interface 61 also receives information relating to a selected value interval I-$G_{eff}$ for an effective gradient amplitude $G_{eff}$ with a minimum value $G_{eff\_min}$ and a maximum value $G_{eff\_max}$ for the effective gradient amplitude $G_{eff}$. The data relating to the value interval I-$G_{eff}$ is then sent to a spherical-shell-determining unit 62 which determines therefrom a spherical shell KS around the origin of the physical gradient axes Gx, Gy, Gz with an inside radius with the minimum value $G_{eff\_min}$ and an outside radius with the maximum value $G_{eff\_max}$. This spherical shell KS can, for example, be depicted as an inequality with said minimum and maximum values and a first-order spherical surface function:

$$G_{eff\_min} < \sqrt{G_x^2 + G_y^2 + G_z^2} < G_{eff\_max}. \qquad (3)$$

The information on the spherical shell KS determined and the values of the maximum gradient amplitudes $G_{max\_x}$, $G_{max\_y}$, $G_{max\_z}$ are sent to a subregion-determining unit 63, which determines therefrom the subregions of the spherical shell KS lying inside the cuboid Q. Therefore, in addition to the inequality (3), these values also have to satisfy the following inequalities:

$$|Gx| <= G_{max\_x}, \qquad (4)$$

$$|Gy| <= G_{max\_y}, \qquad (5)$$

$$|Gz| <= G_{max\_z}. \qquad (6)$$

The gradient coordinates formed by the solutions of the inequality system with the inequalities 3 to 6 can be considered to be end points of possible candidate origin vectors KUV. These candidate origin vectors KUV are then sent to a selecting processor 64. The selecting processor 64 can now automatically select a suitable set of at least six possible isotropic diffusion gradient vectors from the set of candidate origin vectors by taking account of the directional constraints for the diffusion gradient vectors DV that have already been mentioned several times above, wherein an approximate isotropy can be achieved, for example, by the use of a repulsion model, or it communicates via a communication interface 65 with the user or other units of the control computer 13 (see FIG. 7). For example, a user can select a set of apparently suitable diffusion gradient vectors DV from a plurality of candidate sets KS-DV from diffusion gradient vectors DV determined by the selecting processor 64. A final set S-DV of diffusion gradient vectors DV selected is forwarded via an output interface 66 to other units of the control computer 13 (see FIG. 7).

Figure 7:
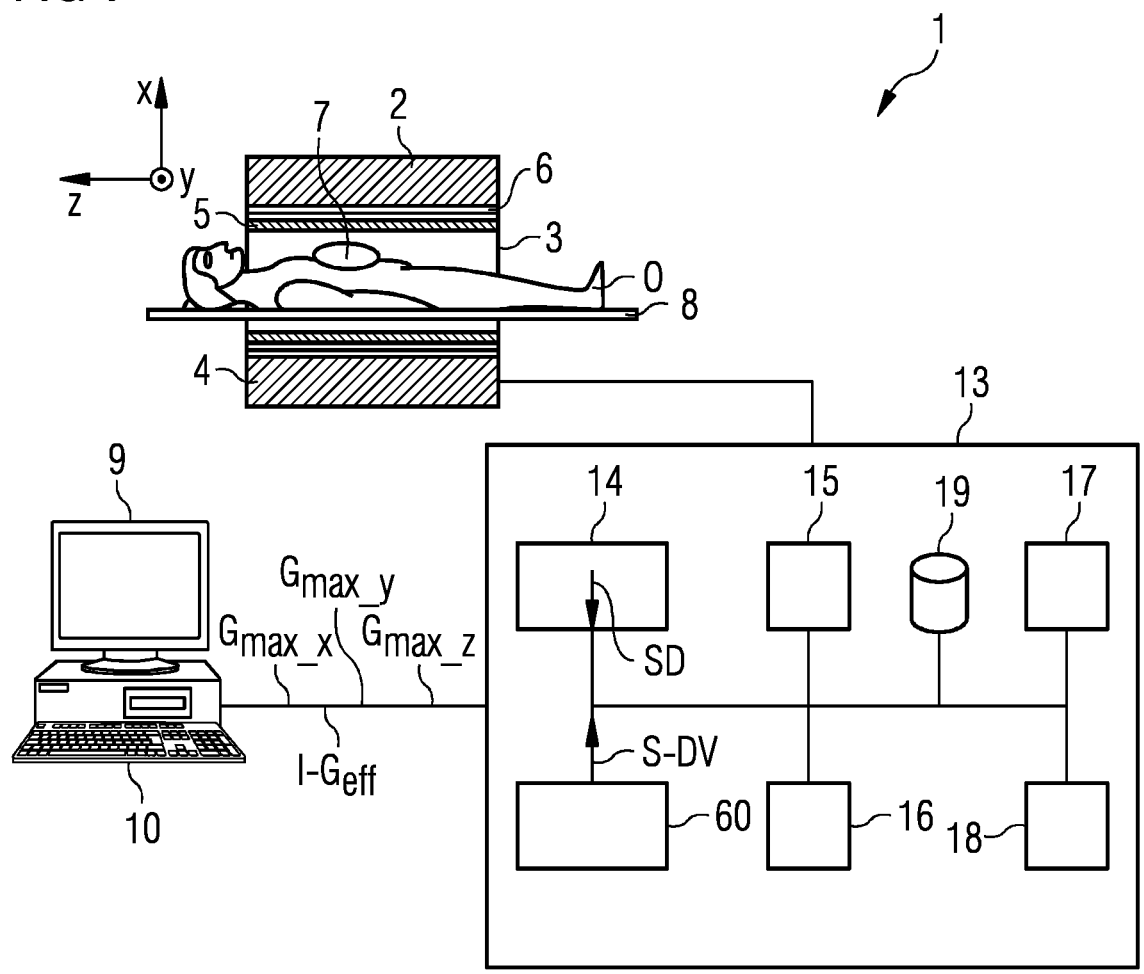
FIG. 7 is a schematic depiction of a magnetic resonance apparatus according to an exemplary embodiment of the invention.

FIG. 7 is a schematic illustration of a magnetic resonance (MR) apparatus 1 according to the invention. The apparatus 1 includes the actual magnetic resonance scanner 2 with an examination chamber 3 or patient tunnel into which an object under examination O, can be moved here a patient or test subject, in which the object under examination is located, for example a specific organ. The object O can be introduced into the scanner 2 on a bed 8.

The magnetic resonance scanner 2 is typically equipped with a basic field magnet 4, a gradient coil arrangement 6 and an RF transmitting antenna 5 and an RF receiving antenna 7. In the exemplary embodiment depicted, the RF transmitting antenna 5 is a whole body coil permanently installed in the magnetic resonance scanner 2. The RF receiving antenna 7 is formed by local coils arranged on the patient or test subject (in FIG. 7 only symbolized by an individual local coil). In principle, the whole body coil can also be used as an RF receiving antenna and the local coils as an RF transmitting antenna, as long as these coils can each be switched to different operating modes.

The MR apparatus 1 also has a central control computer 13 that controls the MR apparatus 1. This central control computer 13 has a sequence controller 14 for pulse sequence control. This controls the sequence of RF pulses and gradient pulses dependent on a selected imaging sequence. An imaging sequence of this kind can be prespecified within a scanning or control protocol, for example. Typically, different control protocols for different scans are stored in a memory 19 and can be selected by a user (and, if required, optionally changed), and then used to carry out the scan.

To emit the individual RF pulses, the central control computer 13 has a radio-frequency transmitter 15, which generates the RF pulses, amplifies them and feeds them via a suitable interface (not shown in detail) into the RF transmitting antenna 5. To control the gradient coils of the gradient coil arrangement 6, the control computer 13 has a gradient interface 16. The sequence controller 14 communicates in a suitable way, for example by sending sequence control data SD, with the radio-frequency transmitter 15 and the gradient interface 16 in order to send the pulse sequences. The control computer 13 also has a radio-frequency receiver 17 (which also communicates in a suitable manner with the sequence controller 14) in order to acquire magnetic resonance signals received from the RF transmitting antenna 7, i.e. raw data, in a coordinated way. A reconstruction processor 18 accepts the acquired raw data and reconstructs the MR-image data therefrom. The image data can then be stored in a memory 19.

The control computer 13 in FIG. 7 also has a diffusion-gradient-determining computer 60 according to an exemplary embodiment of the invention, which determines sets S-DV of suitable diffusion gradient vectors DV in the way described in FIG. 2 to FIG. 6. The sets S-DV of suitable diffusion gradient vectors DV determined are then sent to the sequence controller 14, which performs pulse sequence control on the basis of a scan protocol modified with the determined diffusion gradient vectors DV.

Alternatively, the sets S-DV of determined diffusion gradient vectors DV determined can also be stored in the memory 19 or sent to an input unit 10. Alternatively, the diffusion-gradient-determining computer 60 can be integrated in the input unit 10, for example in the form of software, or connected externally via a network or the like to the central control computer 13.

The central control computer 13 can be operated via a terminal with the input unit 10 and a display unit 9, via which the entire MR apparatus 1 can be operated by an operator. It is also possible for MR images to be displayed on the display unit 9 and for the input unit 10, optionally in combination with the display unit 9, to be used to plan and start scans and to select suitable control protocols with suitable scan sequences, as described above, and optionally modify them. Therefore, the input unit 10 can also be used to choose data sets S-DV of suitable diffusion gradient vectors DV determined by the diffusion-gradient-determining computer 60 and to change an already existing scan protocol in order to change the diffusion gradient vectors DV. In this context, it is also possible to send data between the input unit 10 and the control computer 13, such as the maximum gradient amplitude $G_{max\_x}$, $G_{max\_y}$, $G_{max\_z}$ in the direction of the physical gradient axis Gx, Gy, Gz or a value interval $I\text{-}G_{\mathit{eff}}$ for an effective gradient amplitude $G_{\mathit{eff}}$, from the input unit 10 to the control computer 13.

The MR apparatus 1 according to the invention and in particular the control computer 13 can in addition have further components, which are not shown individually here but that are usually present on such devices, such as a network interface in order to connect the entire system to a network and to enable the exchange of raw data and/or image data or parameter maps and also further data, such as patient-relevant data or control protocols.

The manner by which the radiation of RF pulses and the generation of gradient fields enable the acquisition of suitable raw data and the reconstruction of MR images therefrom is known to those skilled in the art, and thus need not be explained in more detail herein. Also known in principle to those skilled in the art is a wide variety of scan sequences, such as EPI scan sequences or other scan sequences for the generation of diffusion-weighted images.

Method and structures described above in detail are exemplary embodiments only, and the described basic principles can be varied by those skilled in the art without departing from the scope of the invention. As noted, the method for recording diffusion-weighted magnetic resonance image data of an object under examination is not restricted to diffusion-weighted imaging using a Stejskal-Tanner sequence, nor is the described method restricted to medical applications. The term "unit" does not preclude the function of such an item by a number of components, which may be spatially distributed.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for determining diffusion vectors, which respectively define diffusion gradients to be generated by a gradient coil arrangement of a magnetic resonance (MR) data acquisition scanner in order to acquire diffusion-weighted MR raw data along anisotropic diffusion directions, said method comprising:

providing a computer with an electronic designation of maximum gradient amplitudes of respective gradients to be generated by said gradient coil arrangement in respective directions of physical gradient axes of said gradient coil arrangement, said physical gradient axes intersecting at an origin;

in said computer, dependent on said maximum gradient amplitudes, defining a space of achievable diffusion gradient vectors as a cuboid with edges respectively oriented along said physical gradient axes, and with said edges of said cuboid respectively having an extent corresponding to the maximum gradient amplitude along the physical gradient axes of the respective edge;

in said computer, selecting a value range for an effective gradient amplitude, said value range having a minimum value and a maximum value for the effective gradient amplitude;

in said computer, determining a spherical shell around said origin, said spherical shell having an inside radius having said minimum value and an outside radius having said maximum value;

in said computer, determining a plurality of sub-regions of said spherical shell that lie inside said cuboid and that represent end points of a plurality of candidate origin vectors that each originate at said origin and proceed to the respective end points;

in said computer, selecting a set of at least six diffusion gradient vectors, which additionally satisfy directional constraints for tensors, from said set of candidate origin vectors; and making an electronic designation of said at least six diffusion gradient vectors available from said computer as an output.

2. A method as claimed in claim 1 comprising, in said computer, using, as said directional constraints for tensors, a constraint that no two diffusion gradient vectors, among said at least six diffusion gradient vectors, are parallel or antiparallel, a constraint that if three vectors among said at least six diffusion gradient vectors are coplanar, another three vectors among said at least six diffusion gradient vectors must be linearly independent, and a constraint that no four vectors among said at least six diffusion gradient vectors are coplanar.

3. A method as claimed in claim 1 comprising, in said computer, selecting said minimum value of said effective gradient amplitude to be larger than $\sqrt{2}$ times a smallest of the maximum gradient amplitudes and to select said maximum value of said effective gradient amplitude to be less than $\sqrt{3}$ times a largest of said maximum gradient amplitudes.

4. A method as claimed in claim 1 comprising, in said computer, defining said cuboid as a cube with the respective maximum gradient amplitudes along the respective edges of the cubes being equal.

5. A method as claimed in claim 1 comprising, in said computer, selecting said value range for said effective gradient amplitude so as to converge toward a limit value at which the minimum value and the maximum value for the effective gradient amplitude equal said limit value, and determining said spherical shell as a spherical surface.

6. A method as claimed in claim 5 comprising, in said computer, selecting said sub-regions of said spherical shell as surface segments of said spherical surface that are inside said cuboid.

7. A method as claimed in claim 1 comprising, in said computer, defining said cuboid as a cube with the respective maximum gradient amplitudes along the respective edges of the cubes being equal, and comprising, in said computer, selecting said value range for said effective gradient amplitude so as to converge toward a limit value at which the minimum value and the maximum value for the effective gradient amplitude equal said limit value, and determining said spherical shell as a spherical surface, and comprising selecting the value for the effective gradient amplitude as $$\sqrt{\frac{9}{4}}$$

times the maximum gradient amplitudes ($G_{max}$), and selecting said at least six diffusion gradient vectors as:

$(G_x, G_y, G_z) = [(1, 1, -1/2), (1, -1/2, 1), (-1/2, 1, 1),$
$(1, 1, 1/2), (1, 1/2, 1), (1/2, 1, 1)]*G_{max}$.

8. A method as claimed in claim 1 comprising providing said computer with an electronic designation of a defined and known anisotropy of diffusion in a region of a subject from which said diffusion-weighted MR image data are to be acquired, and, in said computer, selecting said at least six diffusion gradient vectors additionally dependent on said defined and known anisotropy of said diffusion in said region.

9. A method as claimed in claim 8 comprising determining respective orientations of the at least six diffusion gradient vectors so as to extend parallel or perpendicular to a preferred orientation of tissue structures in said region.

10. A method as claimed in claim 9 comprising selecting said six diffusion gradient vectors for use in a trace-weighted diffusion quantification.

11. A method as claimed in claim 1 comprising selecting multiple sets of at least six diffusion gradient vectors with each set being selected respectively for diffusion tensors with different b-values.

12. A method as claimed in claim 1 comprising selecting said at least six diffusion gradient vectors so as to have respective directions that are anisotropic.

13. A method for acquiring diffusion-weighted MR raw data along anisotropic diffusion directions, determined by diffusion vectors, which respectively define diffusion gradients to be generated by a gradient coil arrangement of a magnetic resonance (MR) data acquisition scanner, said method comprising:

providing a computer with an electronic designation of maximum gradient amplitudes of respective gradients to be generated by said gradient coil arrangement in respective directions of physical gradient axes of said gradient coil arrangement, said physical gradient axes intersecting at an origin;

in said computer, dependent on said maximum gradient amplitudes, defining a space of achievable diffusion gradient vectors as a cuboid with edges respectively oriented along said physical gradient axes, and with said edges of said cuboid respectively having an extent corresponding to the maximum gradient amplitude along the physical gradient axes of the respective edge;

in said computer, selecting a value range for an effective gradient amplitude, said value range having a minimum value and a maximum value for the effective gradient amplitude;

in said computer, determining a spherical shell around said origin, said spherical shell having an inside radius having said minimum value and an outside radius having said maximum value;

in said computer, determining a plurality of sub-regions of said spherical shell that lie inside said cuboid and that represent end points of a plurality of candidate origin vectors that each originate at said origin and proceed to the respective end points;

in said computer, selecting a set of at least six diffusion gradient vectors, which additionally satisfy directional constraints for tensors, from said set of candidate origin vectors;

making an electronic designation of said at least six diffusion gradient vectors available from said computer as an output;

from said computer, operating said MR data acquisition scanner to acquire said diffusion-weighted MR raw data with said gradient coil arrangement being operated to produce diffusion gradients in respective directions corresponding to the determined at least six diffusion gradient vectors;

in a reconstruction computer, reconstructing diffusion encoded image data from the acquired raw data; and from said reconstruction computer, presenting said diffusion-encoded image data in a visualization that shows diffusion behavior in said region.

14. A method as claimed in claim 13 comprising configuring said visualization with said diffusion behavior visualized dependent on a non-linearity of said gradient coil arrangement.

15. A computer for determining diffusion vectors, which respectively define diffusion gradients to be generated by a gradient coil arrangement of a magnetic resonance (MR) data acquisition scanner in order to acquire diffusion-weighted MR image data along anisotropic diffusion directions, said computer comprising:

an input interface configured to receive an electronic designation of maximum gradient amplitudes of respective gradients to be generated by said gradient coil arrangement in respective directions of physical gradient axes of said gradient coil arrangement, said physical gradient axes intersecting at an origin;

a processor configured to define, dependent on said maximum gradient amplitudes, a space of achievable diffusion gradient vectors as a cuboid with edges respectively oriented along said physical gradient axes, and with said edges of said cuboid respectively having an extent corresponding to the maximum gradient amplitude along the physical gradient axes of the respective edge;

said processor being configured to select a value range for an effective gradient amplitude, said value range having a minimum value and a maximum value for the effective gradient amplitude;

said processor being configured to determine a spherical shell around said origin, said spherical shell having an inside radius having said minimum value and an outside radius having said maximum value;

said processor being configured to determine a plurality of sub-regions of said spherical shell that lie inside said cuboid and that represent end points of a plurality of candidate origin vectors that each originate at said origin and proceed to the respective end points;

said processor being configured to select a set of at least six diffusion gradient vectors, which additionally satisfy directional constraints for tensors, from said set of candidate origin vectors; and an output interface configured to make an electronic designation of said at least six diffusion gradient vectors available from said processor as an output.

16. A magnetic resonance (MR) apparatus comprising:

an MR data acquisition scanner having a gradient coil arrangement with physical gradient axes that intersect at an origin, said gradient coil arrangement being operable to generate diffusion gradients defined by diffusion vectors in order to acquire diffusion-weighted MR raw data along anisotropic diffusion directions;

a computer provided with an electronic designation of maximum gradient amplitudes of respective gradients to be generated by said gradient coil arrangement in respective directions of the physical gradient axes of said gradient coil arrangement;

said computer being configured to define dependent on said maximum gradient amplitudes, a space of achievable diffusion gradient vectors as a cuboid with edges respectively oriented along said physical gradient axes, and with said edges of said cuboid respectively having an extent corresponding to the maximum gradient amplitude along the physical gradient axes of the respective edge;

said computer being configured to select a value range for an effective gradient amplitude, said value range having a minimum value and a maximum value for the effective gradient amplitude;

said computer being configured to determine a spherical shell around said origin, said spherical shell having an inside radius having said minimum value and an outside radius having said maximum value;

said computer being configured to determine a plurality of sub-regions of said spherical shell that lie inside said cuboid and that represent end points of a plurality of candidate origin vectors that each originate at said origin and proceed to the respective end points;

said computer being configured to select a set of at least six diffusion gradient vectors, which additionally satisfy directional constraints for tensors, from said set of candidate origin vectors;

said computer being configured to make an electronic designation of said at least six diffusion gradient vectors available from said computer as an output; and said computer being configured to operate said MR data acquisition scanner to acquire said diffusion-weighted MR raw data with said gradient coil arrangement being operated to produce diffusion gradients in respective directions corresponding to the determined at least six diffusion gradient vectors;

a reconstruction computer configured to reconstruct diffusion encoded image data from the acquired raw data; and said reconstruction computer being configured to present said diffusion-encoded image data in a visualization that shows diffusion behavior in said region.

17. A non-transitory, computer-readable data storage medium encoded with programming instructions, said data storage medium being loaded into a computer of a magnetic resonance (MR) apparatus comprising an MR data acquisition scanner having a gradient coil arrangement with physical gradient axes that intersect at an origin, said gradient coil arrangement being operable to generate diffusion gradients defined by diffusion vectors in order to acquire diffusion-weighted MR raw data along anisotropic diffusion directions, and said programming instructions causing said computer to:

receive an electronic designation of maximum gradient amplitudes of respective gradients to be generated by said gradient coil arrangement in respective directions of physical gradient axes of said gradient coil arrangement, said physical gradient axes intersecting at an origin;

dependent on said maximum gradient amplitudes, define a space of achievable diffusion gradient vectors as a cuboid with edges respectively oriented along said physical gradient axes, and with said edges of said cuboid respectively having an extent corresponding to the maximum gradient amplitude along the physical gradient axes of the respective edge;

select a value range for an effective gradient amplitude, said value range having a minimum value and a maximum value for the effective gradient amplitude;

determine a spherical shell around said origin, said spherical shell having an inside radius having said minimum value and an outside radius having said maximum value;

determine a plurality of sub-regions of said spherical shell that lie inside said cuboid and that represent end points of a plurality of candidate origin vectors that each originate at said origin and proceed to the respective end points;

select a set of at least six diffusion gradient vectors, which additionally satisfy directional constraints for tensors, from said set of candidate origin vectors; and make an electronic designation of said at least six diffusion gradient vectors available from said computer as an output.

\* \* \* \* \*